United States Patent [19]

Nakano

[11] Patent Number: 5,165,990
[45] Date of Patent: Nov. 24, 1992

[54] STAMPABLE SHEET

[75] Inventor: Akikazu Nakano, Osaka, Japan

[73] Assignee: Idemitsu Kosan Co., Ltd., Tokyo, Japan

[21] Appl. No.: 615,471

[22] Filed: Nov. 19, 1990

[30] Foreign Application Priority Data

Nov. 28, 1989 [JP] Japan .................................. 1-306736

[51] Int. Cl.$^5$ ...................... B29C 24/00; C08L 25/02; B32B 1/02; B32B 17/04
[52] U.S. Cl. ...................... 428/288; 428/136; 428/132; 428/224; 525/132
[58] Field of Search ................ 428/288, 244; 264/136; 525/132

[56] References Cited

U.S. PATENT DOCUMENTS 4,622,192  11/1986  Ma ........................................ 264/136
4,946,897  8/1990  Albizzati et al. ..................... 525/132

FOREIGN PATENT DOCUMENTS 0314146  5/1989  European Pat. Off. .
0358135  3/1990  European Pat. Off. .
1265588  10/1989  Japan .

OTHER PUBLICATIONS

Database WPIL, No. 90-017299, Derwent Publications Ltd., London, GB; & JP-A-1 265 588 (Dow Chemical Co.) Oct. 23, 1989.

Primary Examiner—Patrick J. Ryan
Assistant Examiner—Richard Weisberger
Attorney, Agent, or Firm—Frishauf, Holtz, Goodman & Woodward

[57] ABSTRACT

A stampable sheet which comprises 95 to 20% by weight of styrene polymer having a syndiotactic configuration (a) and 5 to 80% by weight of fibrous reinforcing material having an average fiber length of at least 1 mm (b) which is excellent in heat resistance, impact resistance, dimensional stability and dielectric properties is disclosed.

24 Claims, No Drawings

STAMPABLE SHEET

BACKGROUND OF THE INVENTION

1. Field of the Invention

The present invention relates to a stampable sheet, more specifically, it relates to a stampable sheet being excellent in heat resistance, impact resistance, dimensional stability and dielectric properties, said sheet comprising a styrene polymer having a syndiotactic configuration and a specific fibrous reinforcing material.

2. Description of the Related Arts

Recently, composite materials comprising thermoplastic resin filled with inorganic fillers as lightweight materials which are excellent in heat resistance and mechanical strength have been extensively developed. Requirements for these materials have become restricted to accommodate to diversification of their applications.

Particularly, high heat resistance and mechanical strength are required for stampable sheet which is widely used for automobile part such as a bumper, electrical and electronic part.

It has been known that sheet-like materials obtained by blending mat-like reinforcing material and polyamide, polyolefin, polyester or the like are suitable for stamping. However, the sheet utilizing polyolefin has problem that it can not sufficiently satisfy the strict restrictions for heat resistance, and the sheet utilizing polyamide, polyester or the like disadvantageously requires strict moisture control to prevent hydrolysis during molding.

Further, a composition which comprises polystyrene having a syndiotactic configuration and an inorganic filler as a composition for stampable sheet excellent in heat resistance and mechanical strength has been previously proposed (see, Japanese Patent Application Laid-Open No. 257948/1987).

However, since the above composition is obtained by melt mixing of a polystyrene having a syndiotactic configuration and an inorganic filler using a singly-screw or twin-screw extruder, long glass fibers may be ground during said melt mixing. As the result, stampable sheet molded using said composition has low impact resistance, i.e. its Izod impact strength is lower than 10 kg.cm/cm.

Recently, in the field of printed board, single-sided printed circuit board, double-sided printed circuit board, and multi-layer printed circuit board have been developed as demand for high density printed circuit board increases, and at the same time, circuit has been getting finer. With such circumstances, infrared reflow soldering has been becoming the mainstream instead of the conventional flow soldering. Using the infrared reflow soldering, the board may be exposed at higher temperature for longer period of time compared with the case using flow soldering. Thus, improvement of heat resistance such as dimensional stability, warp inhibition property and the like of the base during such soldering has been required.

As a multi-layer printed circuit board, base materials with low dielectric constant have been required in the field wherein high performance operation is required, for example, in computer.

Bumper back-up beam made of long-fiber reinforced polypropylene sheet has been proposed to overcome the defects of the conventional metallic bumper and to provide markedly lighter bumper excellent in mechanical strength especially stiffness and impact resistance. However, stiffness of such bumper is insufficient at high temperature, which is required to be improved.

As mentioned above, stampable sheet which satisfies requirements in various applications such as heat resistance, impact resistance, dimensional stability, dielectric properties has not been proposed, yet.

The present inventor has studied intensively to solve these problems of the conventional arts and to develop stampable sheet excellent in heat resistance, impact resistance, dimensional stability, dielectric properties and free from moisture control during molding which is required for the material using polyamide or polyester.

SUMMARY OF THE INVENTION

As the result, it has been found that a stampable sheet comprising a styrene polymer having a syndiotactic configuration and a fibrous reinforcing material achieves the above object. The present invention has been attained based on such findings.

That is, the present invention provides a stampable sheet which comprises 95-20% by weight of a styrene polymer having a syndiotactic configuration (a) and 5-80% by weight of fibrous reinforcing material with average fiber length of not less than 1 mm (b).

Here, the component (a), i.e., a styrene polymer having a syndiotactic configuration means a styrene polymer wherein stereochemical structure is a syndiotactic configuration, that is, the stereostructure in which phenyl groups or substituted phenyl groups as side chains are located alternately in opposite directions relative to the main chain consisting of carbon-carbon bounds. It is general to quantitatively determine stereoregularity (tacticity) by the nuclear magnetic resonance method ($^{13}$C-NMR method) using carbon isotope, which is excellent in accuracy. The tacticity measured by the $^{13}$C-NMR method can be indicated in terms of proportions of structural units continuously connected to each other, i.e., a diad in which two structural units are connected to each other, a triad in which three structural units are connected to each other and a pentad in which five structural units are connected to each other. The styrene polymer having a syndiotactic configuration in the present invention means styrene polymer having such syndiotacticity that the proportion of racemic diad is at least 75%, preferably at least 85%, or proportions of racemic pentad is at least 30% and preferably at least 50%. The example includes, polystyrene having the above stereoregularity, poly(alkylstyrene), poly(halogenated styrene), poly(halogenated alkylstyrene), poly(alkoxystyrene), poly(vinyl benzoate ester), hydrogenated polymers thereof and mixture thereof, or copolymers containing these structural units.

Here, the poly(alkylstyrene) includes, for example, poly(methylstyrene), poly(ethylstyrene), poly(butylstyrene), poly(phenylstyrene), poly(vinylnaphthalene), poly(vinylstyrene); and the poly(halogenated styrene) includes, for example, poly(chlorostyrene), poly(bromostyrene) and poly(fluorostyrene). The poly(halogenated alkylstyrene) includes poly(chloromethylstyrene). The poly(alkoxystyrene) includes, for example, poly(methoxystyrene), poly(ethoxystyrene).

Comonomer of the copolymer containing these structural units includes, in addition to the above-described monomer of styrene polymer, olefin monomer such as ethylene, propylene, butene, hexene, octene; diene monomer such as butadiene, isoprene; cyclic olefin monomer; cyclic diene monomer or polar vinyl monomer such as methyl methacrylate, maleic anhydride, acrylonitrile.

Among them, particularly preferred styrene polymer includes, for example, polystyrene, poly(alkylstyrene), hydrogenated polystyrene and copolymers containing these structural units.

Molecular weight of the styrene polymer is not particularly limited, but the styrene polymers having weight average molecular weight of 10,000 to 1,000,000, especially, 100,000 to 800,000 are most suitable. When weight average molecular weight is less than 10,000, sufficient strength cannot be obtained. Weight average molecular weight over 1,000,000 is not preferable because fluidity of styrene polymer may be undesirably lowered, dipping ability into glass fiber, especially mat-like or sheet-like glass tissue is low, resulting in low strength and compression moldability of the resulting stampable sheet. Two or more styrene polymers having molecular weight within said range may be combined to control viscosity. Further, crystallinity, structure and shape of crystals and the like are not particularly limited and may be properly selected depending on applications of the resulting stampable sheet or the like.

For example, the above styrene polymer having a syndiotactic configuration can be produced by polymerization of styrene monomers (monomer corresponding to the above polymers) using a titanium compound and a condensation product of water and trialkylaluminum as a catalyst in, for example, an inert hydrocarbon solvent, or in the absence of a solvent (Japanese Patent Application Laid-Open No. 187708/1987). Poly(halogenated alkylstyrene) and hydrogenated polymer thereof may be obtained according to the methods described in Japanese Patent Application Laid-Open Nos. 46912/1989 and 178505/1989, respectively.

In the present invention, the shape of the component (a) is not particularly limited and generally it may be powder, pellet, fiber, sheet, fiber molded into mat or the like. The shape varies depending on the composition state with the component (b). If the component (a) is mixed with the component (b), the former is preferably powder, pellet or fiber. Size of the component in the aforementioned shape may not be particularly limited and properly selected depending on the component (b) or the like. If the component (a) is laminated on the component (b), sheet or fibers molded into mat is preferred. Thickness of the sheet or mat is 1 μm to 10 mm, most preferably, 10 μm to 5 mm. Width and length of the sheet may be properly selected depending on the application. Crystallinity of the styrene polymer molded into sheet is optional, but preferably low, i.e., not more than 30% from the viewpoint of molding and processing operations.

The component (a) of the present invention is as described above. For improvement of adhesion to the component (b), it is preferable to further compound a polymer having a polar group which contains polyphenylene ether or polyphenylene ether and a styrene polymer as a main ingredient as a component (c). Adhesion between the components (a) and (b) may be markedly improved by compounding the above component (c), and stampable sheet which is particularly excellent in mechanical properties and accompanied with less deterioration of mechanical properties under high humidity can be obtained. Here, polymer with a polar group which contains polyphenylene ether or polyphenylene ether and styrene polymer as a main ingredient is as follows. The styrene polymer compounded in the component (c) to improve adhesion includes the following compounds. That is, polymers which have at least 25% by weight of the repeating unit, derived from the vinyl aromatic compound represented by the general formula:

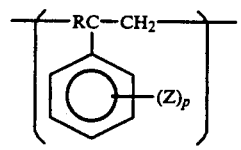

(wherein R is a hydrogen or an alkyl group having 1 to 4 carbon atoms, Z is a hydrogen, a halogen atom, or an alkyl group having 1 to 4 carbon atoms, and p is an integer of 1 to 5) can be used.

Stereoregularity of such styrene polymer is not particularly limited, and styrene polymers with any configuration, such as isotactic, atactic or syndiotactic configuration may be used. Examples of such styrene polymers are homopolymer of styrene or its derivatives; styrene polymer modified by natural or synthetic elastomer material such as polybutadiene, polyisoprene, isobutylene-isoprene rubber, EPDM, ethylene propylene copolymer, natural rubber, epichlorohydrin; further, styrene-containing copolymers including styrene-methylstyrene copolymer, styrene-butadiene copolymer and the like. Among them, particularly preferred are styrene polymers having a syndiotactic configuration, atactic polystyrene, isotactic polystyrene, polybutadiene-modified styrene polymer, butadiene-styrene copolymer, isoprene-styrene copolymer, and high impact resistant polystyrene (HIPS).

Further, an example of such styrene polymer is a styrene polymer obtained by introducing at least one of the compounds including acrylonitrile, methyl methacrylate, methacrylonitrile and the like to the aforementioned styrene polymer. The amount of the styrene polymer to be blended with polyphenylene ether is preferably not more than 80% by weight.

Polyphenylene ether in the component (c) which is used for the purpose of enhancement of adhesion is known itself. It is described in the specifications of U.S. Pat. Nos. 3,306,874, 3,306,875, 3,257,357 and 3,257,358. Polyphenylene ether can be prepared usually by oxidation coupling reaction in which homopolymer or copolymer is produced in the presence of a copper amine complex and one or more of phenols substituted at two or three positions. Therein copper amine complexes derived from primary, secondary or tertiary amines can be used. Example of preferred polyphenylene ethers are poly(2,3-dimethyl-6-ethylphenylene-1,4-ether), poly(2-methyl-6-chloromethyl-1,4-phenylene)ether, poly(2-methyl-6-hydroxydiethyl-1,4-phenylene)ether, poly(2-methyl-6-n-butyl-1,4-phenylene)ether, poly(2-ethyl-6-isopropyl-1,4-phenylene)ether, poly(2-ethyl-6-n-propyl-1,4 phenylene)ether, poly(2,3,6-trimethylphenylene-1,4-ether), poly[2-(4'-methylphenyl)phenylene-1,4-ether, poly(2-bromo-6-phenylphenylene-1,4-ether), poly(2-methyl-6-phenylpenylene-1,4-ether), poly(2-phenylphenylene-1,4-ether), poly(2-chlorophenylene-1,4-ether), poly(2-methylphenylene-1,4-ether), poly(2-chloro-6-ethylphenylene-1,4-ether), poly(2-chloro-6-bromophenylene-1,4-ether), poly(2,6-di-n-propylphenylene-1,4-ether), poly(2-methyl-6-isopropylphenylene-1,4-ether), poly(2-chloro-6-methylphenylene-1,4-ether), poly(2-methyl-6-ethylphenylene-1,4-ether), poly(2,6-dibromophenylene-1,4-ether), poly(2,6-dichlorophenylene-1,4-ether), poly(2,6-diethylphenylene-1,4-ether) and poly(2,6-dimethylphenylene-1,4-ether).

Also copolymers derived from two or more of phenyl compounds as used for the preparation of above-mentioned homopolymer are suitable. Further examples are graft copolymers and block copolymers of vinyl aromatic compounds including polystyrene and the above-mentioned polyphenylene ether.

The polar groups include acid halide, a carbonyl group, acid anhydride, acid amide, carboxylate, acid azide, a sulfone group, a nitrile group, a cyano group, an isocyanic acid ester group, an amino group, a hydroxyl group, an imide group, a thiol group, an oxazoline group, and an epoxy group. Particularly preferable polar group is acid anhydrides, among which maleic anhydride is more preferable. The content of said polar group is preferably not less than 0.01% by weight of the above polyphenylene ether, and if it is under 0.01% by weight, mechanical strength of resulting polymer cannot be expected to be improved.

In order to obtain said component (c), i.e., polymer having a polar group which contains polyphenylene ether or polyphenylene ether and styrene polymer as a main ingredient, (1) a method to polymerize one or plural kinds of phenol compounds having these polar groups; (2) a method to copolymerize one or plural kinds of phenol compounds having a polar group with phenol compounds having no polar compounds; (3) a method to react styrene polymer, a compound containing both a polar group and an unsaturated group with polyphenylene ether; and (4) a method wherein polyphenylene ether and a compound containing both a polar group and an unsaturated group are melt modified in the same manner as reaction extrusion; can be used. In the melt modification, for example, radical initiator can be added. Alternatively, a method for solution modification of polyphenylene ether or polymer containing polyphenylene ether and styrene polymer as main ingredients in a solution using a compound containing both a polar group and an unsaturated group such as maleic anhydride can be employed.

Above-mentioned compounds containing both a polar group and an unsaturated group are those which contain, in a molecular, both of an unsaturated group having carbon-carbon double bond or carbon-carbon triple bond; and a polar group such as carboxylic acid group, a group derived from carboxylic acid (for example, various salts, esters, acid amides, acid anhydrides, imides, acid azides, and acid halides which results from substitution of hydrogen atoms or a hydroxyl group of carboxyl group), or oxazoline, nitrile, epoxy group, amino group, hydroxyl group or isocyanate ester group.

As the compound containing both of an unsaturated group and a polar group, unsaturated carboxylic acid, unsaturated carboxylic acid derivative, unsaturated epoxy compound, unsaturated alcohol, unsaturated amine, unsaturated isocyanate and the like are mainly used.

Specific examples of these compounds are maleic anhydride, maleic acid, fumaric acid, maleimide, maleic hydrazide, reaction products of maleic anhydride and diamine such as the compounds having the structure represented by the formula:

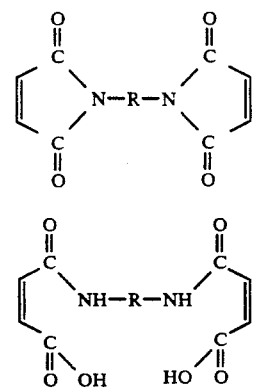

(wherein R is an aliphatic group, or an aromatic group); methyl nadic anhydride, dichloromaleic anhydride, maleic acid amide, itaconic acid, itaconic anhydride, acids of natural fats and oils such as soybean oil, tung oil, castor oil, linseed oil, hempseed oil, cottonseed oil, sesami oil, rapeseed oil, peanut oil, camellia oil, olive oil, coconut oil, and sardine oil; unsaturated carboxylic acids such as acrylic acid, butenoic acid, crotonic acid, vinylacetic acid, methacrylic acid, pentenoic acid, angelic acid, teblinic acid, 2-pentenoic acid, 3-pentenoic acid, α-ethylacrylic acid, β-methylcrotonic acid, 4-pentenoic acid, 2-hexenoic acid, 2-methyl-2-pentenoic acid, 3-methyl-2-pentenoic acid, α-ethylcrotonic acid, 2,2-dimethyl-3-butenoic aicd, 2-heptenoic acid, 2-octenoic acid, 4-decenoic acid, 9-undecenoic acid, 10-undecenoic acid, 4-dodecenoic acid, 5-dodecenoic acid, 4-tetradecenoic acid, 9-tetradecenoic acid, 9-hexadecenoic acid, 2-octadecenoic acid, 9-octadecenoic acid, eicosenoic acid, dococenoic acid, erucic acid, tetracocenoic acid, mieribeneic acid, 2,4-pentadienoic acid, 2,4-hexadienoic acid, diallyl acetic acid, geraniumic acid, 2,4-decadienoic acid, 2,4-dodecadienoic acid, 9,12-hexadecadienoic acid, 9,12-octadecadienoic acid, hexadecatrienoic aicd, linolic acid, linolenic acid, octadecatrienoic acid, eicosadienoic acid, eicosatrienoic acid, eicosatetraenoic acid, ricinolic acid, eleostearic acid, oleic acid, eicosapentaenoic acid, erucic acid, docosadienoic acid, docosatrienoic acid, docosatetraenoic acid, docosapentaenoic aicd, tetracosenoic acid, hexacosenoic acid, hexacodienoic acid, octacosenoic acid, traconcenoic acid, and esters, acid amides and anhydrides of these unsaturated carboxylic acid; unsaturated alcohols such as allyl alcohol, crotyl alcohol, methylvinyl carbinol, allyl carbinol, methylpropenyl carbinol, 4-pentene-1-ol, 10-undecan-1-ol, propargyl alcohol, 1,4-pentadien-3-ol, 1,4-hexadien-3-ol, 3,5-hexadien-2-ol, 2,4-hexadien-1-ol, alcohols represented by the general formulas: $C_nH_{2n-5}OH$, $C_nH_{2n-7}OH$, $C_nH_{2n-9}OH$ (n is a positive integer), 3-buten-1,2-diol, 2,5-dimethyl-3-hexen-2,5-diol, 1,5-hexadien-3,4-diol, and 2,6-octadien-4,5-diol, and unsaturated amines which result from substitution of $NH_2$ for OH group of these unsaturated alcohols; those result from addition of maleic anhydride or phenols to low polymers (e.g., polymers having an average molecular weight of 500 to 10,000) or high-molecular polymers (e.g., those having an average molecular weight of 10,000 or more) of butadiene or isoprene; those compounds to which amino group, carboxyl group, hydroxyl group or epoxy group is introduced; and allyl isocyanate.

Examples of the vinyl compounds having epoxy group are glycidyl methacrylate, glycidyl acrylate, vinyl glycidyl ether, glycidyl ether of hydroxyalkyl(meth)acrylate, glycidyl ether of polyalkyleneglycol(meth)acrylate, and glycidylitaconate, among which glycidyl methacrylate is particularly preferred.

The compound having both of an unsaturated group and a polar group in the present invention also includes, needless to say, compounds having two or more of unsaturated groups and two or more of polar groups (the same or different), and two or more of compounds having such groups.

If the component (c), i.e., a polymer having a polar group which contains polyphenylene ether or polyphenylene ether and styrene polymer as a main ingredient is added to the component (a), the amount to be added is 0.1 to 50 parts by weight, preferably, 0.5 to 30 parts by weight, more preferably, 1 to 20 parts by weight based on 100 parts by weight of the component (a). If the amount of the component (c) to be added is under 0.1 parts by weight, improvement of mechanical property is not observed, and if it exceeds 50 parts by weight, crystallization becomes difficult, occasionally accompanied with reduced heat resistance.

As the component (b) in the present invention, i.e., a fibrous reinforcing material with an average fiber length of at least 1 mm, fibrous reinforcing material with an average fiber length of at least 1 mm, preferably at least 5 mm may be used without particular limitation. Examples of such fibrous reinforcing material include inorganic fibers such as glass fiber, carbon fiber, ceramic fiber of gypsum, potassium titanate, magnesium sulfate, magnesium oxide, asbestos, alumina, silica, boron; wiskers of boron, alumina, silica, silicon carbide; metal fibers of copper, aluminum and steel; and organic fibers such as organic synthetic fibers including all aromatic amide fibers, silk and natural vegetable fiber such as hemp. Particularly preferred are glass fibers, carbon fibers and all aromatic amide fibers.

The shape of the fibrous reinforcing material is not particularly limited. The fibrous reinforcing material having an average fiber length of at least 1 mm, preferably at least 10 mm, and an average fiber diameter of 0.1 to 50 μm, preferably 1 to 30 μm may be used. Generally, the example includes fiber, chopped strand, whisker, continuous long fiber or sheet or mat prepared using the above materials.

When mixed with the component (a), the material in the shape of fiber, chopped strand, wisker or the like is preferred. When laminated on the component (a), the material in the shape of continuous fiber, sheet, mat or the like is preferred. Preferred example includes chopped strand mat prepared using chopped strand with an average fiber length of 5 to 30 mm; continuous long fiber mat obtained by laminating continuous long fibers with an average fineness of 5 μm to 30 μm into swir-like laminate; and continuous long fiber mat obtained by needle-punching of said continuous long fiber mat, or continuous long fiber mat wherein continuous long fibers are paralleled in one directions. The amount of these mats are optional, but it is 250 to 1,200 kg/m$^2$, preferably, 300 to 600 kg/m$^2$. As the component (b), these materials may be used alone or in an optional combination thereof. Particularly preferable example contains a least 15% by weight of mat in the whole fibrous reinforcing materials.

The present invention is a stampable sheet which comprises a styrene polymer having a syndiotactic configuration and the aforementioned long fiber reinforcing material. Considering the shape of the final product, short fiber reinforcing material such as chopped strand glass fiber may be added. In this case, the amount of the reinforcing material is preferably less than 30% by weight based on a styrene polymer having a syndiotactic configuration. Further, considering productivity, ground waste pieces of the previously prepared stampable sheet may be added.

The component (b) of the present invention is as described above. Other particle or powder fillers may be added as needed. Such particle or powder fillers include, for example, talc, carbon black, graphite, titanium dioxide, silica, mica, calcium carbonate, calcium sulfate, barium carbonate, magnesium carbonate, magnesium sulfate, barium sulfate, oxysulfate, tin oxide, alumina, kaolin, silicon carbide, metal powder, glass powder, glass flake, glass beads and the like. Talc, calcium carbonate, and mica are particularly preferred. A preferred average particle diameter of talc is 0.3 to 20 μm, more preferably, 0.6 to 10 μm. A preferred average particle diameter of calcium carbonate is 0.1 to 20 μm, and preferred average particle diameter of mica is 40 to 250 μm, and more preferably 50 to 150 μm.

In the various fillers as above, particularly preferred are glass fillers such as glass powder, glass flake, glass beads, glass filament, glass fiber, glass roving, and glass mat.

Surface treatment of the component (b) and the aforementioned fillers with a coupling agent may be preferably carried out for improving adhesiveness with the component (a). The coupling agent used for the surface treatment may be optionally selected from the compounds known as so-called silane coupling agent, titanium coupling agent, isocyanate coupling agent, amine coupling agent or the like. Specific examples of the silane coupling agents are triethoxysilane, vinyltris(β-methoxyethoxy)silane, γ-methacryloxypropyltrimethoxysilane, γ-glycidoxypropyltrimethoxysilane, β-(1,1-epoxycyclohexyl)ethyltrimethoxysilane, N-γ-(aminoethyl)-γ-aminopropyltrimethoxysilane, N-β-(aminoethyl)-γ-aminopropylmethyldimethoxysilane, γ-aminopropyltriethoxysilane, N-phenyl-γ-aminopropyltrimethoxysilane, γ-mercaptopropyltrimethoxysilane, γ-chloropropyltrimethoxysilane, γ-aminopropyltrimethoxysilane, γ-aminopropyl-tris(2-methoxyethoxy)silane, N-methyl-γ-aminopropyltrimethoxysilane, N-vinylbenzyl-γ-aminopropyltriethoxysilane, triaminopropyltrimethoxysilane, 3-ureidopropyltrimethoxysilane, 3-(4,5-dihydroimidazole)propyltriethoxysilane, hexamethyldisilazane, N,O-(bistrimethylsilyl)amide, N,N-bis(trimethylsilyl)urea and the like. Among them, preferre are aminosilanes and epoxysilanes such as γ-aminopropyltriethoxysilane, N-β-(aminoethyl)-γ-aminopropyltrimethoxysilane, γ-glycidoxypropyltrimethoxysilane, β-(3,4-epoxycyclohexyl)ethyltrimethoxysilane. It is particularly preferable to use aminosilanes as described above.

Preferred examples of titanium coupling agents are specifically, isopropyltriisostearoyl titanate, isopropyltridodecylbenzenesulfonyl titanate, isopropyltris(dioctylpyrophosphate) titanate, tetraisopropylbis(dioctylphosphite) titanate, tetraoctylbis(ditridecylphosphite) titanate, tetra(1,1-diallyloxymethyl-1-butyl)bis(ditridecyl)phosphite titanate, bis(dioctylpyrophosphate)oxyacetate titanate, bis(dioctylpyrophosphate)ethylene titanate, isopropyltrioctanoyl titanate, isopropyldimethacrylisostearoyl titanate, isopropylisostearoyldiacryl titanate, isopropyltri(dioctylphosphate) titanate, isopropyltricumylphenyl titanate, isopropyltri(N-amideethyl, aminoethyl) titanate, dicumylphenyloxyacetate titanate, and diisostearoylethylene titanate. Among them, preferred is isopropyltri(N-amideethyl, aminoethyl) titanate.

Surface treatment using these coupling agents can be carried out according to the conventional methods, without a particular limitation. More specifically, a sizing treatment in which the organic solvent solution or suspending solution of the above coupling agent is applied as a sizing agent on the filler, drying and mixing with the use of Henschel mixer, a super mixer, or V-shape blender; the spray method, the integral blend method, or the dry concentrate method can be used appropriately depending on the form of fillers. Preferred are the sizing treatment, the dry mixing and the spray method.

With the above coupling agent, film-forming materials for glass can be used in combination. Said film-forming materials are not particularly limited but include polyesters, urethane polymers, epoxy polymers, acryl polymers and vinyl acetate polymers.

The sheet of the present invention comprises the above components (a) and (b) in principle. But if necessary, various additives, other thermoplastic resins, rubber-like elastomers including aforementioned component (c) can be blended, so long as the object of the present invention is not hindered. Examples of the aforementioned additives are an antioxidant such as phosphate ester, phosphate ester described in Japanese Patent Application Laid-Open No. 284244/1988; an UV absorbent, an aliphatic carboxylate or paraffin external lubricant as described in Japanese Patent Application Laid-Open Nos. 201350/1989 and 202939/1990, a nucleating agent such as an organic acid metal salt and an organic phosphorus compound, a mold release agent, an antistatic agent, a colorant, a flame retardant, an auxiliary flame retardant.

The aforementioned thermoplastic resins include polyphenylene ether without any polar groups, polyolefin such as polyethylene, polypropylene, polybutene and polypentene, polyester such as polyethylene terephthalate, polybytylene terephthalate and polyethylene naphthalate, polythioether such as polyphenylene sulfide, polycarbonate, polyarylate, polysulfone, polyether ether ketone, polyether sulfone, polyimide, polyamide imide, polymethyl methacrylate, an ethylene-acrylic aicd copolymer, an acrylonitrile-styrene copolymer, an acrylonitrile-chlorinated polyethylene-styrene copolymer, an ethylene-vinyl acetate copolymer, an ethylene-vinyl alcohol copolymer, an acrylonitril-butadiene-styrene copolymer, a vinyl chloride resin, chlorinated polyethylene, fluorinated polyethylene, polyacetal, a thermoplastic polyurethane elastomer, 1,2-polybutadiene and styrene-maleic anhydride. The preferable thermoplastic resin is the one having affinity or reactivity with the component (a). If polyphenylene ether having the aforementioned functional group is used as the component (c), the preferable thermoplastic resin includes a polymer to which the compound having both a polar group and an unsaturated group, which is used for introduction of a polar group to polyphenylene ether having a polar group as component (c), is introduced by melting reaction, solution reaction or polymerization, for example, polyolefin such as polyethylene, polypropylene, polybutene and polypentene; polyphenylene sulfide; polyester such as polyethylene terephthalate, polybutylene terephthalate and polyethylene naphthalate; polycarbonate, polyarylate, polysulfone, polyether ether ketone, polyether sulfone, polyimide terketone, polyether sulfone, polyimide, polyamide imide, polymethyl methacrylate, an ethylene-acrylate copolymer, an acrylonitrile-styrene copolymer, an acrylonitrile-chlorinated polyethylene-styrene copolymer, an ethylene-vinyl acetate copolymer, an ethylene-vinyl alcohol copolymer, an acrylonitril-butadiene-styrene copolymer, polyacetal and styrene-maleic anhydride copolymer. The most preferable thermoplastic resins include maleic anhydride-modified polyethylene, polypropylene, a styrene-maleic anhydride copolymer, polyarylate, polycarbonate, polyphenylene sulfide containing an epoxy group, polyphenylene sulfide containing an amino group, polyamide and the like.

As said polyamide, all the conventional thermoplastic polyamide can be used. Examples of preferred polyamides are polyamide-4; polyamide-6; polyamide-4,6; polyamide-6,6; polyamide-3,4; polyamide-12; polyamide-11; polyamide-6,10; polyamide purified from terephthalic aicd and 4,4'-diaminocyclohexylmethane; polyamide purified from azelaic acid, adipic acid and 2,2-bis(p-aminocyclohexyl)propane; polyamide purified from adipic acid and methaxylylene diamine; and polyamide purified from terephthalic acid and trimethylhexamethylene diamine.

Aromatic polyamide resin (PA) is a polyamide containing an amide bond having an aromatic nucleus, as a repeating unit, in its main chain. More specifically, the aromatic polyamide resin is appropriately selected from the polymers which are obtained by reacting, according to the conventional method, $\omega'$-carboxylic compound having aromatic group with the polymer obtained by reacting an aromatic diamine component and a dicarboxylic acid component.

As the aromatic diamine components, diamine compounds having benzene ring, of which typical examples are 1,4-diaminobenzene; 1,3-diaminobenzene; 1,2-diaminobenzene; 2,4-diaminotoluene; 2,3-diaminotoluene; 2,5-diaminotoluene; 2,6-diaminotoluene; ortho-, meta-, and para-xylilene diamine; ortho-, meta-, and para-2,2'-diaminodiethylbenzene; 4,4'-diaminobiphenyl; 4,4'-diaminodiphenyl methane; 4,4'-diaminodiphenyl ether; 4,4'-diaminodiphenyl thioether; 4,4'-diaminodiphenyl ketone; and 4,4'-diaminodiphenyl sulfone, are used. The aromatic diamine component may be solely the diamine compound having the above benzene ring, or may be a mixture with other diamine compounds such as aliphatic diamines, as long as said diamine compound is contained in the amount of at least 50 mol %. Of course, two or more kinds of diamine compounds having benzene ring may be used in combination.

Next, examples of dicarboxylic acid components are aliphatic dicarboxylic compounds such as glutaric acid, adipic acid, pimelic acid, suberic acid, azelaic acid, and sebacic acid; aromatic dicarboxylic compounds such as phthalic acid, isophthalic acid, terephthalic acid, naphthalene dicarboxylic acid and the like; and further, acid chlorides of these dicarboxylic compounds. These compounds can be used in combination.

Further, exmaples of $\omega$-amino-$\omega'$-carboxylic compounds having an aromatic nucleus are 4-aminophenyl-carboxyl methane, 1-(4-aminophenyl)-2-carboxyl ethane, 3-(4-aminophenyl)-1-carboxyl propane, para-(3-amino-3'-hydroxy)dipropyl benzene and the like. Preferred aromatic polyamided resins are polyamides derived from diamine compound having benzene ring and aliphatic dicarboxylic acid, and a more preferable example is a polyamide derived from xylylene diamine and adipic acid. The most preferable example is a polyamide derived from metha-xylylene diamine and adipic acid.

Various rubber-like elastomers can be used, and the most preferable one is a rubber-like copolymer containing a styrene compound as one component. Examples are styrene-butadiene copolymer rubber (SBR), a styrene-butadiene block copolymer (SB, SBS, BSB, etc.), a styrene-hydrogenated butadiene block copolymer (SEBS, SEB, etc.), a styrene-isoprene block copolymer (SI, SIS, ISI, etc.), a styrene-hydrogenated isoprene block copolymer (SEP, SEPS, etc.), or as described in Japanese Patent Application Laid-Open No. 292049/1989, a granular elastomer obtained by polymerizing a vinyl monomer in the presence of the polymer obtained by polymerizing one or at least two monomers selected from the group consisting of alkyl acrylate, alkyl methacrylate and a multi-functional monomer having a conjugated diene type double bond. Examples of the granular elastomer include acrylonitrile-styrene grafted butadiene rubber (ABS), acrylonitrile-styrene grafted butadiene-butyl acrylate copolymer rubber (AABS), methyl methacrylate-styrene grafted butylacrylate rubber (MAS), styrene grafted butadiene rubber (SB), methyl methacrylate-styrene grafted butadiene rubber (MBS) and methyl methacrylate-styrene grafted butadiene-butyl acrylate copolymer rubber (MABS).

Further, examples are one or at least two block or graft copolymers selected from an A-B type block copolymer, an A-grafted B copolymer and a B-grafted A copolymer, wherein A is at least one styrene polymers or styrene copolymers selected from atactic polystyrene, acrylonitrile-styrene random copolymer, styrene-maleic anhydride random copolymer, styrene-acrylonitrile-anhydrous maleimide random copolymer, styrene-methyl methacrylate random copolymer and styrene-methacrylic acid random copolymer, and B is at least one polymer selected from polybutadiene, polyisoprene, hydrogenated polybutadiene, hydrogenated polyisoprene and polycarbonate, and at least one polymer selected from polyamide, polymethyl methacrylate, polyethylene terephthalate and polybutylene terephthalate.

Further, the rubber-like elastomers include, in addition to the above, natural rubber, polybutadiene, polyisoprene, polyisobutyrene, neoprene, ethylene-propylene copolymer rubber, polysulfide rubber, thiokol rubber, acrylic rubber, urethane rubber, silicone rubber and epichlorohydrin rubber.

The rubber-like elastomer modified by reacting with the compound having a polar group and an unsaturated group used for introduction of the polar group to polyphenylene ether having a polar group, may be used.

Among the aforementioned flame retardants, particularly halogen flame retardants and phosphorus flame retardants are preferable. The halogen flame retardants include, for example, tetrabromobisphenol A, tetrabromophthalic anhydride, hexabromobenzene, tribromophenylallyl ether, pentabromotoluene, pentabromophenol, tribromophenyl-2,3-dibromo propyl ether, tris(2,3-dibromopropyl)phosphate, tris(2-chloro-3-bromopropyl)phosphate, octabromodiphenyl ether, decabromodiphenyl ether, octabromobiphenyl, pentachloropentacyclodecane, hexabromocyclododecane, hexachlorobenzene, pentachlorotoluene, hexabromobiphenyl, decabromobiphenyl, decabromobiphenyl oxide, tetrabromobutane, decabromodiphenyl ether, hexabromodiphenyl ether, ethylene-bis(tetrabromophthalimide), tetrachlorobisphenol A, tetrabromobisphenol A, an oligomer of tetrachlorobisphenol A or tetrabromobisphenol A, a halogenated polycarbonate oligomer such as a brominated polycarbonate oligomer, a halogenated epoxy compound, polychlorostyrene, halogenated polystyrene such as polytribromostyrene, poly(dibromophenylene oxide) and bis(tribromophenoxy)ethane.

The phosphorus flame retardants include ammonium phosphate, tricresyl phosphate, triethyl phosphate, acidic phosphate and triphenylphosphene oxide.

Among them, the preferable flame retardants are particularly polytribromostyrene, poly(dibromophenylene oxide), decabromodiphenyl ether, bis(tribromophenoxy)ethane, ethylene-bis-(tetrabromophthalimide), tetrabromobisphenol A and a brominated polycarbonate oligomer.

The above flame retardant is blended in the proportion of 3 to 40 parts by weight, preferably 5 to 35 parts by weight based on 100 parts by weight of the total amount of the above components (a) and (b).

And further, in the present invention, it is preferable to use an auxiliary flame retardant with the above flame retardant. Various auxiliary flame retardants can be used, for example, antimony auxiliary flame retardant such as antimony trioxide, antimony pentaoxide, sodium antimonate, metal antimony, antimony trichloride, antimony pentachloride, antimony trisulfide and antimony pentasulfide. Also, in addition to the above, zinc borate, barium metaborate and zirconium oxide can be used. Among them, particularly antimony trioxide is preferable.

Said auxiliary flame retardant is blended in the proportion of 1 to 15 parts by weight, preferably 2 to 10 parts by weight based on 100 parts by weight of the total amount of the above components (a) and (b).

Further, in the present invention, to prevent melt dropping, a tetrafluoroethylene polymer can be used. Specific examples of the tetrafluoroethylene polymer are, in addition to the tetrafluoroethylene homopolymer, (polytetrafluoroethylene), a copolymer of tetrafluoroethylene and hexafluoropropylene, and further a tetrafluoroethylene copolymer containing a few co-polymerizable ethylenically unsaturated monomers. The tetrafluoroethylene polymer containing 65 to 76% by weight, preferably 70 to 76% by weight of fluorine is used.

The above tetrafluoroethylene polymer is blended in the proportion of 0.003 to 10 parts by weight, preferably 0.02 to 2 parts by weight, more preferably 0.1 to 2 parts by weight based on 100 parts by weight of the total amount of the above components (a) and (b).

The stampable sheet of the present invention comprises the above components (a) and (b), and desirable additives and the like. The process for preparing such stampable sheet includes, for example, a process wherein the components (a) and (b) are mixed and melted to mold, or a process wherein at least two of layers consisting of the component (a) and layers consisting of the component (b) are alternately laminated and processed. In both of mixing and laminating, the compounding ratio of the components (a) and (b) is such that the component (a) is 20 to 95 parts by weight and component (b) is 80 to 5 parts by weight, preferably, the component (a) is 30 to 90 parts by weight and the component (b) is 70 to 10 parts by weight, more preferably, the component (a) is 40 to 90 parts by weight and the component (b) is 60 to 10 parts by weight. If the component (a) is less than 20 parts by weight, that is, if the component (b) exceeds 80 parts by weight, the component (b) can not be sufficiently dispersed in the component (a). Accordingly, for example, heat resistance, impact resistance, mechanical properties of the resulting sheet are insufficient, which is undesirable. If the component (a) exceeds 95 parts by weight, that is, if the component (b) is less than 5 parts by weight, the effect obtained by blending the component (b) is insufficient, and the resulting sheet is not practical because of its insufficient heat resistance, impact resistance, mechanical properties and the like.

The processes for preparing the stampable sheet of the present invention will be illustrated below. First, in the process wherein the components (a) and (b) are mixed and melted, the components (a) and (b) are mixed at the above ratio by dry blend, a mixer or the like, and subsequently melted. The shape of the component (a) is preferably powder, pellet or fiber, and that of the component (b) is preferably fiber, chopped strand, wisker or the like. The melt temperature is not particularly limited, but generally, it is higher than melting point of the component (a) and lower than the temperature 80° C. higher than the melting point of the component (a). If the temperature 80° C. higher than the melting point of the component (a) exceeds 350° C., the melt temperature is not higher than 350° C. If the melt temperature is lower than the melting point of the component (a), the component (a) insufficiently melts. Accordingly, fusion of the components (a) and (b) is insufficient and the product is insufficient for practical application. Over the temperature 80° C. higher than the melting point of the component (a) or over 350° C., deterioration of the component (a) occurs, and problems of deterioration of the mechanical properties attributable to yellowing, coloring, generation of gas or the like may undesirably arise.

Further, after melting, the product is cooled at room temperature to melting point of the component (a), preferably, not higher than 200° C. Rate of cooling is not particularly limited and cooling may be carried out under proper conditions.

Thus, the stampable sheet of the present invention can be obtained.

Next, the process wherein two or three or more of layers consisting of the components (a) and (b) are alternately laminated will be explained. In this case, it is sufficient to alternately laminate layers consisting of the component (a) and layers consisting of the component (b), and the number of the layers is optional. They should be laminated in such a way that the outer layers consist of the component (a). Such lamination includes, for example, (1) layers of the component (a) in the form of powder, pellet or fiber and layers of the component (b) in the form of mat, sheet are laminated;

(2) layers of the component (a) in the form of mat, sheet and layers of the component (b) in the form of mat, sheet are laminated;

(3) layers of the component (a) in the molten state and layers of the component (b) in the form of mat, sheet are laminated. The ratio of the layer of the component (a) to the layer of the component (b) may be such that the aforementioned compounding ratio in the sheet after lamination may be obtained.

In the above case (1), the layers are laminated in the order, for example, (a):(b):(a):(b):(a). Subsequently, the conditions for pressing, temperature and the like which are not particularly limited are properly selected to sufficiently fuse the component (a) to the component (b). Further, the product is cooled to obtain the objective sheet.

In the above case (2), lamination is followed by heating in a mold which is set at the temperature not lower than melting point of the component (a) and not higher than the temperature higher than melting point of the component (a) by 80° C. or not higher than 350° C. for 0.1 seconds to 20 minutes with or without pressure. Then, cooling is carried out, preferably under pressure of 0.01 to 100 kg/cm$^2$.

In the above case (3), the layers may be laminated in an optional order, but the process wherein the layers are laminated continuously in the order of sheet of the component (a): the component (b): molten sheet of the component (a): the component (b): sheet of the component (a) is preferred from the viewpoint of productivity. Processing is carried out by continuously feeding the product between rollers set at the temperature similar to that of the aforementioned mold. Cooling is carried out in a mold or rollers set at the temperature in the range from room temperature to melting point of the component (a), preferably not higher than 200° C., under pressure of about 0.01 to 100 kg/cm$^2$. Particularly, the process wherein the melt and pressure molded product is continuously cooled between rollers is preferred from the viewpoint of productivity.

The stampable sheet of the present invention is prepared by the aforementioned processes, but not limited to them.

Thickness of the stampable sheet is optional. Generally, it is from 0.1 to 20 mm. Crystallinity of the component (a) of the stampable sheet is not particularly limited, but preferably not higher than 30%.

When stamping is carried out using thus obtained stampable sheet of the present invention, the product may be molded by various methods depending on the types of the objective sheet. As molding conditions, pre-heating temperature is from melting point of the component (a) to the temperature lower than melting point of the component (a) by 80° C. or not higher than 350° C. The material is pre-heated in an infrared oven, a convection oven, a dielectric heating oven, or a heating furnace of the combination of the above ovens. Press molding is carried out at the temperature from room temperature to the temperature lower than melting point of the component (a), preferably from 100° to 200° C., more preferably, from 120° to 190° C., under pressure of 10 to 500 kg/cm$^2$, preferably, from 30 to 300 kg/cm$^2$ for 1 to 300 seconds.

The stampable sheet of the present invention can be used in various applications. For example, applications for automobile parts includes, acoustic barrier, arm rest, A/T shift base, intake manifold, inner panel upper, inner panel lower, intercooler protect, air guide, air duct, air deflector, air cleaner cover, air conditioner heater adapter, L side cover, engine under cover, engine sound insulating plate, oil pan (oil sump), compartment hatch, compartment door, gocart chassis, tire wheel, dick lid, distributor cap, tail gate inner panel, door beam, tonneau cover, gearbox cover, transmission console, truck fan shroud, truck step, torque chain cover, torque converter bracket, sound shield, tray of sunshine roof, shade of sunshine roof, seat, seat cushion, seat belt retractor, seat shell, sealside gate, spare tire case, stone guard, splash cover, piller of inner or outer layer, oil fuel storage tank cover, package tray, battery tray, battery box cover, valve cover, bumper beam, heat shield, fender extension, floor tray, floor deck, floor panel support, front end retainer, front seat shell, brake pedal, brake lever, fender seal, fender, fender apron, head lamp support, pedal box, wheel cover, mat set cover, license plate bracket, radiator end tank, radiator support beam, radiator fan support, lamp housing, lamp bracket, lamp assembly, rear parcel rack, rear spoiler, road floor, rocker panel and the like.

Examples of the applications other than above ones include, for example, entry door, snow board, various trays, chair, container, pallet, access floor (roof of house), cable splice cover, welding mask, various helmets, box, housing, big computer panel, jack holder, seat back, seat base, splash guard, step, hose band, handle for window, ski binding, chain-saw gear, transelector housing, fuse housing, oil server, printed board, concrete frame board.

As mentioned above, the stampable sheet of the present invention is excellent in heat resistance, impact resistance, dimensional stability and the like, and conditions for molding is relatively simple.

Accordingly, the stampable sheet of the present invention can be effectively used as raw sheet material for automobile parts such as door panel, cylinder head cover, bumper back up beam, and electrical and electronic parts such as printed board and the like.

The present invention is described in greater detail with reference to examples and comparative examples.

REFERENCE EXAMPLE 1

Preparation of a Contact Product of Trimethylaluminum and Water

In a 500-milliliter glass vessel in which air had been replaced with argon, 17.8 g (71 mmol) of copper sulfate pentahydrate ($CuSO_4.5H_2O$), 200 ml of toluene and 24 ml (250 mmol) of trimethylaluminum were placed and reacted at 40° C. for 8 hours. And then, from the solution obtained by removing the solid, the toluene was further distilled away under reduced pressure at room temperature to obtain 6.7 g of a contact product. The molecular weight of the product as determined by the freezing point depression method was 610.

PRODUCTION EXAMPLE 1

Production of Styrene Polymer

In a 2-liter reactor, 1 L (L=liter) of purified styrene, 7.5 mmol of the contact product obtained in the above Reference Example 1 as aluminum atom, 7.5 mmol of triisobutyl aluminum and 0.038 mmol of pentamethylcyclopentadienyl titanium trimethoxide were placed and polymerized at 90° C. for 5 hours. After completion of the reaction, a catalyst component of the product was decomposed with sodium hydroxide in methanol, then the resultant was washed with methanol repeatedly and dried to obtain 466 g of a polymer.

The weight average molecular weight of said polymer as determined by gel permeation chromatography at 130° C. using 1,2,4-trichlorobenzene as a solvent was 290,000, and weight average molecular weight/number average molecular weight was 2.72. The melting point and $^{13}$C-NMR measurements confirmed that said polymer was polystyrene having a syndiotactic configuration (SPS).

PRODUCTION EXAMPLE 2

Production of Styrene Polymer

In a 2-liter reactor, 1 L of purified styrene, 5 mmol as aluminum atom of the contact product obtained in the above Reference Example 1, 5 mmol of triisobutyl aluminum and 0.025 mmol of pentamethylcyclopentadienyl titanium trimethoxide were placed and polymerized at 90° C. for 5 hours. After completion of the reaction, a catalyst component of the product was decomposed with sodium hydroxide in methanol, then the resultant was washed with methanol repeatedly and dried to obtain 308 g of a polymer.

The weight average molecular weight of said polymer as determined by gel permeation chromatography at 130° C. using 1,2,4-trichlorobenzene as a solvent was 389,000, and weight average molecular weight/number average molecular weight was 2.64. The melting point and $^{13}$C-NMR measurements confirmed that said polymer was polystyrene having a syndiotactic configuration.

PRODUCTION EXAMPLE 3

Production of Styrene Polymer

In a 2-liter reactor, 1 L of purified styrene, 7.5 mmol as aluminum atom of the contact product obtained in the above Reference Example 1, 7.5 mmol of triisobutyl aluminum and 0.038 mmol of pentamethylcyclopentadienyl titanium trimethoxide were placed and polymerized at 70° C. for 3 hours. After completion of the reaction, a catalyst component of the product was decomposed with sodium hydroxide in methanol, then the resultant was washed with methanol repeatedly and dried to obtain 580 g of a polymer.

The weight average molecular weight of said polymer as determined by gel permeation chromatography at 130° C. using 1,2,4-trichlorobenzene as a solvent was 592,000, and weight average molecular weight/number average molecular weight was 2.81. The melting point and $^{13}$C-NMR measurements confirmed that said polymer was polystyrene having a syndiotactic configuration.

PRODUCTION EXAMPLE 4

Production of Styrene Polymer

In a 2-liter reactor, 1 L of purified styrene, 5 mmol as aluminum atom of the contact product obtained in the above Reference Example 1, 5 mmol of triisobutyl aluminum and 0.025 mmol of pentamethylcyclopentadienyl titanium trimethoxide were placed and polymerized at 70° C. for 5 hours. After completion of the reaction, a catalyst component of the product was decomposed with sodium hydroxide in methanol, then the resultant was washed with methanol repeatedly and dried to obtain 477 g of a polymer.

The weight average molecular weight of said polymer as determined by gel permeation chromatography at 130° C. using 1,2,4-trichlorobenzene as a solvent was 802,000, and weight average molecular weight/number average molecular weight was 2.24. The melting point and $^{13}$C-NMR measurements confirmed that said polymer was polystyrene having a syndiotactic configuration.

PRODUCTION EXAMPLE 5

Production of Styrene Polymer

With 100 parts by weight of poly(2,6-dimethyl-1,4-phenylene) ether (PPO) (catalogue No. 18178-1, produced by Aldorich Co.), 0.5 parts by weight of maleic anhydride (S Grade, produced by Wako Junyaku Co.) and 0.2 parts by weight of t-butylhydroxy peroxide (trade name: Perbutyl H, produced by Nippon Oil & Fats Co., Ltd.) as a peroxide were mixed by a Henschel mixer, and then the resulting mixture was kneaded by the twin-screw extruder at 300° to 320° C. under heat melting to obtain maleic anhydride-modified PPO.

The resulting maleic anhydride-modified PPO was dissolved in toluene, and then the resulting mixture was reprecipitated dropwise with methanol to be purified. The purified maleic anhydride-modified PPO was molded by compression. The peak due to a carbonyl group was observed by an infrared ray measurement to confirm that the PPO was modified by maleic anyhydride.

EXAMPLE 1

To 100 parts by weight of powdery polystyrene having a syndiotactic configuration obtained in Production Example 1, which had not been pre-dried, 0.7 parts by weight of tetrakis(2,4-di-t-butylphenyl)-4,4'-biphenylene phosphite (trade name: illugaphos P-EPQ: produced by Chiba-Geigy) as an antioxidant and 0.1 parts by weight of tetrakis [methylene-3,5-di-t-butyl-4-hydroxyhydrocinnamate)]-methane (trade name: MARK A060; produced by Adeca Eargus) were added, and the resultant was melt extruded by an single-screw extruder (aperture: 40 mm) with a T-die at the tip thereof at the cylinder temperature of 300° C. The resultant was slowly cooled to give a continuous sheet (width: 300 mm, thickness: 1.2 mm).

The resulting sheet was cut off to length of 500 mm. The sheet and continuous long fiber mat (diameter of fiber: 20 μm, produced by Nippon Sheet Glass Company, Limited) were piled up (in the order of sheet: mat: sheet: mat: sheet) to bring the glass fiber content of the resulting sheet to 30% by weight. Then the product was fed into hot press set at 310° C., preheated for 1.5 minutes, then heated for 3 minutes under pressure of 25 kg/cm², fed into cold press set at 80° C. and pressed at 120 kg/cm² to effect lamination, providing sheet for stamping (stampable sheet) (500 mm×300 mm×5 mm).

The obtained sheet was preheated in an infrared heater (atmospheric temperature: 300° C.) for 3 minutes, placed in a mold (set temperature: 180° C.), molded at pressure of 80 kg/cm² (pressure dwell: 3 minutes) to give a molded product (thickness: 5.0 mm). Test strips for bending test and Izod test were cut out from the resulting molded product, and flexural strength and flexural modulus, heat deformation temperature and Izod impact value were measured according to JIS K 7203, JIS K 7207, JIS K 7110, respectively. The results are shown in Table 2.

EXAMPLES 2 to 4 and COMPARATIVE EXAMPLES 1 and 2

The procedure of Example 1 was repeated except that number of sheets and mats, glass fiber content, types of glass fiber mat shown in Table 1 were used, and stampable sheet was obtained. The mechanical properties of the products are shown in Table 2.

EXAMPLE 5

To 100 parts by weight of powdery polystyrene having a syndiotactic configuration obtained in Production Example 3, 0.7 parts by weight of tetrakis(2,4-di-t-butylphenyl)-4,4'-biphenylene phosphite (trade name: illugaphos P-EPQ: produced by Chiba-Geigy) as an antioxidant and 0.1 parts by weight of tetrakis[methylene-3,5-di-t-butyl-4-hydroxyhydrocinnamate)]methane (trade name: MARK A060; produced by Adeka Agas) were added, and the resultant was melt extruded by an single-screw extruder (aperture: 40 mm) with a T-die (die opening: 550 mm) at the tip thereof (cylinder temperature: 320° C.). At the same time, the previously prepared sheet and glass continuous long fiber mat were piled up (in the order of sheet:mat: molten sheet of styrene having a syndiotactic configuration: mat:sheet, from the bottom), then immediately laminated between metal rollers under pressure, subsequently passed through cold rollers, and stampable sheet (1,000 mm×450 mm×5 mm) was obtained using a cutter.

The sheet cut out from the obtained sheet was preheated in an infrared heater (atmospheric temperature: 320° C.) for 3 minutes, placed in a mold (set temperature: 180° C.), molded at pressure of 60 kg/cm² (pressure dwell: 3 minutes) to give a molded product. Test strips for bending test and Izod test were cut out from the resulting molded product, and their mechanical properties were measured. The results are shown in Table 2.

EXAMPLES 6 to 11

The procedure of Example 5 was repeated except that types of starting materials, the amount to be compounded shown in Table 1 were used, and stampable sheet was obtained. The mechanical properties are shown in Table 2.

COMPARATIVE EXAMPLE 3

Polyethylene terephthalate (intrinsic viscosity: 0.6) which had not been dried was melt extruded using a single-screw extruder (aperture: 40 mm) with a T-die at the tip thereof (cylinder temperature: 280° C.). The product was foamed and a sheet was obtained.

COMPARATIVE EXAMPLE 4

Nylon 6,6 (2020 B produced by Ube Industries, Ltd.) which had not been dried was melt extruded using a single-screw extruder (aperture: 40 mm) with a T-die at the tip thereof (cylinder temperature: 290° C.). The product was vigorously foamed and a sheet was obtained.

COMPARATIVE EXAMPLE 5

The procedure of Example 1 was repeated except that polypropylene (Idemitsu Polypropylene J465H produced by Idemitsu Petorchemical C., Ltd.) was used instead of powdery styrene polymer having a syndiotactic configuration and an antioxidant was not used. Polypropylene sheet and glass fiber were piled up, fed into a hot press (set temperature: 250° C.). After preheating for 1.5 minutes, the product was heated at pressure of 25 kg/cm² for 3 minutes, fed into a cold press (set temperature: 50° C.) and laminated applying pressure of 120 kg/cm². Thus, stamping sheet (500 mm×300 mm×5 mm) was obtained.

The obtained sheet was preheated in an infrared heater (atmospheric temperature: 280° C.) for 3 minutes, placed in a mold (set temperature: 50° C.), molded at pressure of 80 kg/cm² (pressure dwell: 3 minutes) to give a molded product (thickness: 5.0 mm). Test strips for bending test and Izod test were cut out from the resulting molded product in the same manner as in Example 2, and their mechanical properties were measured. The results are shown in Table 2.

COMPARATIVE EXAMPLE 6

Powdery styrene polymer having a syndiotactic configuration obtained in Production Example 1 (70% by weight), glass fiber shown in Table 1 (30% by weight) and an antioxidant shown in Table 1 were formulated and dry blended by a Henschel mixer. The blended product was melted and kneaded using a twin-screw extruder (cylinder temperature set at 280° C.) to pelletize.

Using the resulting pellet, the mechanical properties were determined by a injection molding machine (cylinder temperature set at 280° C. and mold temperature at 180° C.). The results are shown in Table 2.

EXAMPLE 12

Swirl-like laminated glass long fiber mats obtained by laminating glass fiber (fiber diameter: 23 μm) on mat wherein glass fibers were paralleled in one direction were piled up, then mechanically bonded to give an integrated laminate. This laminate and sheet of styrene polymer having a syndiotactic configuration were piled up (order, sheet: laminate:sheet:laminate:sheet; glass fiber content, 40% by weight (containing 50% of uniaxially paralleled mat)), fed into a hot press (set at 310° C.), preheated for 1.5 minutes, then heated at pressure of 25 kg/cm² for 3 minutes, fed into a cold press (set at 80° C.) and laminated by applying pressure of 120 kg/cm² to give a stampable sheet (500 mm × 300 mm × 5 mm). The mechanical properties of this sheet were determined. The results are shown in Table 2.

EXAMPLES 13 to 17

The procedure in Example 5 was repeated except that styrene-glycidyl methacrylate copolymer (Blenmer CP1005S produced by Nippon Oil & Fats Co., Ltd.) and maleic anhydride-modified PPO obtained in Production Example 5 were compounded (amount: shown in Table 1), and stampable sheet was obtained. The mechanical properties of this sheet were determined. The results are shown in Table 2.

EXAMPLE 18

To 70% by weight of powdery styrene polymer having a syndiotactic configuration obtained in Production Example 1, which had not been pre-dried, 30% by weight of chopped strand (fiber length, 3.0 mm; fiber diameter, 13 μm; produced by Asahi Fiber Glass) and 100 parts by weight of styrene polymer having a syndiotactic configuration, 0.7 parts by weight of (2,6-di-t-butyl-4-methylphenyl)pentaerythritol diphosphite (trade name: MARK PEP-36; produced by Adeka Agas) as an antioxidant and 0.1 parts by weight of tetrakis[methylene-(3,5-di-t-butyl-4-hydroxyhydrocinnamate)]-methane (trade name: MARK A060; produced by Adeka Agas) were added, and the resultant was dry blended in a Henschel mixer. The blend was fed into a hot press set at 290° C. and preheated for a minute, then heated for 3 minutes while applying pressure of 5 kg/cm², fed into a cold press set at 50° C., laminated by applying pressure of 11.0 kg/cm² to give a stampable sheet (150 mm × 200 mm × 3 mm).

The obtained sheet was preheated in an infrared heater (atmospheric temperature: 290° C.) for 3 minutes, placed in a mold (set temperature: 180° C.), molded at pressure of 50 kg/cm² (pressure dwell: 1 minute) to give a molded product (thickness: 3.2 mm). Test strips for bending test and Izod test were cut out from the resulting molded product, and the mechanical properties were determined. The results are shown in Table 2.

COMPARATIVE EXAMPLE 7

The procedure in Example 18 was repeated except that chopped strand glass fiber (fiber length: 0.5 mm, diameter: 13 μm) was used, and a sheet was obtained. The mechanical properties of the sheet was determined. The results are shown in Table 2.

TABLE 1

| | Component (a) | | Component (b) | | | |
| --- | --- | --- | --- | --- | --- | --- |
| Example No. | Type | Amount (wt %) | Average Length (mm) | Average Diameter (μm) | Type | Amount (wt %) |
| Example 1 | Prod. Ex. 1 | 70 | — | 20 | Glass long fiber mat*4 | 30 |
| Example 2 | Prod. Ex. 1 | 90 | — | 20 | Glass long fiber mat*4 | 10 |
| Example 3 | Prod. Ex. 1 | 50 | — | 20 | Glass long fiber mat*4 | 50 |
| Example 4 | Prod. Ex. 1 | 70 | — | 20 | Chopped Strand mat*3 | 30 |
| Comparative Example 1 | Prod. Ex. 1 | 97 | — | 20 | Glass long fiber mat*4 | 3 |
| Comparative Example 2 | Prod. Ex. 1 | 15 | — | 20 | Glass long fiber mat*4 | 85 |
| Comparative Example 3 | PET*1 | 70 | — | 20 | Glass long fiber mat*4 | 30 |
| Comparative Example 4 | Nylon*2 | 70 | — | 20 | Glass long fiber mat*4 | 30 |
| Comparative Example 5 | Polypropylene | 70 | — | 20 | Glass long fiber mat*4 | 30 |
| Comparative Example 6 | Prod. Ex. 1 | 70 | 3.0 | 13 | Chopped Strand mat*3 | 30 |
| Example 5 | Prod. Ex. 3 | 70 | — | 23 | Glass long fiber mat*4 | 30 |
| Example 6 | Prod. Ex. 4 | 70 | — | 23 | Glass long fiber mat*4 | 30 |
| Example 7 | Prod. Ex. 2 | 50 | — | 23 | Glass long | 50 |

TABLE 1-continued

| Example No. | | | | | | |
|---|---|---|---|---|---|---|
| Example 8 | Prod. Ex. 1 | 40 | — | 23 | Glass long fiber mat*4 | 60 |
| Example 9 | Prod. Ex. 2 | 70 | — | 13 | Glass long fiber mat*4 | 30 |
| Example 10 | Prod. Ex. 2 | 60 | — | 23 | Glass long fiber mat*4 | 20 |
| | | | | | Potassium titanate fiber*11 | 20 |
| Example 11 | Prod. Ex. 2 | 70 | — | 23 | Glass long fiber mat*4 | 30 |
| Example 12 | Prod. Ex. 2 | 60 | — | 23 | Glass long fiber mat*4 | 20 |
| | | | | | Uniaxially paralleled mat*4 | 20 |
| Example 13 | Prod. Ex. 2 | 70 | — | 23 | Glass long fiber mat*4 | 30 |
| Example 14 | Prod. Ex. 2 | 70 | — | 23 | Glass long fiber mat*4 | 30 |
| Example 15 | Prod. Ex. 2 | 70 | — | 23 | Glass long fiber mat*4 | 30 |
| Comparative Example 7 | Prod. Ex. 1 | 70 | 0.5 | 13 | Chopped Strand mat*3 | 30 |
| Example 16 | Prod. Ex. 2 | 50 | — | 23 | Glass long fiber mat*4 | 50 |
| Example 17 | Prod. Ex. 2 | 80 | — | 23 | Glass long fiber mat*4 | 20 |
| Example 18 | Prod. Ex. 1 | 70 | 3.0 | 13 | Chopped Strand mat*3 | 30 |

| Example No. | Antioxdant 1 Type | Antioxidant 1 Amount (part by weight)*5 | Antioxidant 2 Type | Antioxidant 2 Amount (part by weight)*5 | Additive Type | Additive Amount (part by weight)*10 | Amount of Nucleating Agent (part by weight)*10 |
|---|---|---|---|---|---|---|---|
| Example 1 | P-EPQ*6 | 0.7 | AO-60*8 | 0.1 | — | — | — |
| Example 2 | P-EPQ*6 | 0.7 | AO-60*8 | 0.1 | — | — | — |
| Example 3 | P-EPQ*6 | 0.7 | AO-60*8 | 0.1 | — | — | — |
| Example 4 | P-EPQ*6 | 0.7 | AO-60*8 | 0.1 | — | — | — |
| Comparative Example 1 | P-EPQ*6 | 0.7 | AO-60*8 | 0.1 | — | — | — |
| Comparative Example 2 | P-EPQ*6 | 0.7 | AO-60*8 | 0.1 | — | — | — |
| Comparative Example 3 | — | — | — | — | — | — | — |
| Comparative Example 4 | — | — | — | — | — | — | — |
| Comparative Example 5 | — | — | — | — | — | — | — |
| Comparative Example 6 | P-EPQ*6 | 0.7 | AO-60*8 | 0.1 | — | — | — |
| Example 5 | PEP-36*7 | 0.7 | AO-60*8 | 0.1 | — | — | — |
| Example 6 | PEP-36*7 | 0.7 | AO-60*8 | 0.1 | — | — | — |
| Example 7 | — | — | AO-60*8 | 0.1 | — | — | — |
| Example 8 | PEP-36*7 | 0.2 | AO-80*9 | 0.05 | — | — | — |
| Example 9 | PEP-36*7 | 0.5 | AO-60*8 | 0.1 | — | — | 0.2*12 |
| Example 10 | P-EPQ*6 | 0.5 | AO-60*8 | 0.1 | — | — | 1.0*12 |
| Example 11 | P-EPQ*6 | 0.5 | AO-60*8 | 0.1 | CaCO3 | 10.0 | 0.5*12 |
| Example 12 | P-EPQ*6 | 0.5 | AO-60*8 | 0.1 | — | — | — |
| Example 13 | P-EPQ*6 | 0.5 | AO-60*8 | 0.1 | CP1005S*13 | 5.0 | 0.5*12 |
| Example 14 | P-EPQ*6 | 0.5 | AO-60*8 | 0.1 | MA-PPO*14 | 3.5 | 0.5*12 |
| Example 15 | P-EPQ*6 | 0.5 | AO-60*8 | 0.1 | MA-PPO*13 | 7.5 | 0.5*12 |
| Comparative Example 7 | PEP-36*7 | 0.7 | AO-60*8 | 0.1 | — | — | — |
| Example 16 | PEP-36*7 | 0.5 | AO-60*8 | 0.1 | MA-PPO*14 | 10.0 | 0.5*12 |
| Example 17 | PEP-36*7 | 0.5 | AO-60*8 | 0.1 | MA-PPO*14 | 5.0 | 0.5*12 |

TABLE 1-continued

| Example 18 | PEP-36*7 | 0.7 | AO-60*8 | 0.1 | — | — | — |

*1 Intrinsic Viscosity: 0.6
*2 Trade name: 2020B
*3 produced by Asahi Glass Fiber, treated with aminosilane
*4 Glass long fibers were laminated like swirl and needle-punched, treated with aminosilane, produced by Nippon Glass Company, Limited
*5 Based on 110 parts by weight of the component (a)
*6 Illugaphos P-EPQ
*7 MARK PEP-36
*8 MARK AO-60
*9 MARK AO-80
*10 Based on 100 parts by weight of the total of the components (a) and (b)
*11 trade name: "Timos-D by Otsuka Chemical Co., Ltd., (average fiber length: 10 to 20 μm, average fiber diameter: 0.2 to 0.5 μm)
*12 aluminum p-(tert-butyl)benzoate; trade name: PTBBA-Al produced by DAINIPPON INK AND CHEMICALS, INCORPORATED
*13 styrene glycidyl methacrylate copolymer; "Blenmer CP1005S" produced by Nippon Oil & Fats Co., Ltd.
*14 Maleic anhydride-modified PPO obtained Production Example 5

TABLE 2

| Example No. | Flexural Strength (kg/cm²) | Flexural Modulus (kg/cm²) | Izod Impact Value (kg.cm/cm) | Heat Deformation Temperature*1 (°C.) | Moldability |
| --- | --- | --- | --- | --- | --- |
| Example 1 | 1,530 | 80,000 | 59 | 258 | o |
| Example 2 | — | 59,000 | 23 | 251 | o |
| Example 3 | 1,710 | 94,000 | 78 | 268 | o |
| Example 4 | 1,550 | 79,000 | 17 | 249 | o |
| Comparative Example 1 | 850 | 42,000 | 2 | 160 | o |
| Comparative Example 2 | — | — | — | — | x*2 |
| Comparative Example 3 | — | — | — | — | x*3 |
| Comparative Example 4 | — | — | — | — | x*3 |
| Comparative Example 5 | 1,300 | 39,000 | 39 | 151 | o |
| Comparative Example 6 | 1,320 | 79,000 | 5 | 247 | o |
| Example 5 | 1,550 | 72,000 | 72 | 259 | o |
| Example 6 | 1,560 | 75,000 | 79 | 258 | o |
| Example 7 | 1,700 | 96,000 | 116 | 267 | o |
| Example 8 | 1,780 | 104,000 | 125 | 268 | o |
| Example 9 | 1,520 | 79,000 | 83 | 261 | o |
| Example 10 | 1,490 | 82,000 | 67 | 255 | o |
| Example 11 | 1,510 | 77,000 | 78 | 259 | o |
| Example 12 | 1,680 | 100,000 | 96 | 267 | o |
| Example 13 | 1,630 | 96,000 | 86 | 258 | o |
| Example 14 | 1,930 | 97,500 | 88 | 264 | o |
| Example 15 | 1,950 | 98,000 | 88 | 263 | o |
| Comparative Example 7 | 1,260 | 80,000 | 5 | 245 | o |
| Example 16 | 2,160 | 105,000 | 103 | 267 | o |
| Example 17 | 1,870 | 81,000 | 69 | 250 | o |
| Example 18 | 1,380 | 83,000 | 16 | 248 | o |

*1 Load: 18.6 kg/cm²
*2 Dipping of resin was bad, not fluidized in a mold
*3 Foamed during extrusion

APPLICATION EXAMPLE 1

Printed circuit board was produced using a stampable sheet obtained in Example 5. The process for production will be explained below.

The stampable sheet obtained in Example 5 was left at rest in a far infrared heater, preheated at 300° C. for 3 minutes, then placed in a mold set at 180° C., molded under pressure by applying pressure of 60 kg/cm² (pressure dwell: 3 minutes) to obtain a molded plate of 1.6 mm thickness. Crystallinity of the base material as determined by differential scanning calorimeter (DSC) was 50%.

Copper foil for printed plate of 50 μm thickness covered with polyimide adhesive was laminated on the above obtained molded plate to produce printed board.

Using this printed board, dielectric property test was carried out according to JIS C 6481. As the result, dielectric constant was low, i.e., 2.9.

The above molded plate was heated from 30° C. to 150° C. for 50 seconds using an infrared heater, maintained at the temperature for 50 seconds, then further heated to 240° C. for 40 seconds, subsequently cooled to 50° C. for 60 seconds, and dimensional stability under heat was determined. As the result, property modification such as warp, torsion or the like was not observed, with little dimensional change.

APPLICATION EXAMPLE 2

A bumper back up beam was molded using a stampable sheet obtained in Example 17.

The stampable sheet obtained in Example 17 was cut into a proper size, placed in a far infrared heater, preheated at 300° C. for 3 minutes, then molded into bumper back up beam of 6 to 8 mm thickness using a mold set at 150° C.

Test strips for bending test and Izod test were cut out from the obtained molded product. Temperature dependency of flexural strength was measured using a test strip for bending test and Izod impact test was carried out using a test strip for Izod test. The results are shown below.

| Stampable Sheet of Example 17 | | |
| --- | --- | --- |
| | 23° C. | 80° C. |
| Flexural Strength (kg/cm²) | 2,100 | 1,800 |
| Flexural Modulus (kg/cm²) | 104,000 | 93,000 |
| Izod Impact Value (kg · cm/cm) | 98 | — |

In the same manner, a bumper beam was molded using a stampable sheet of polypropylene obtained in Control Example 5. The results are shown in the following table.

| Stampable Sheet of Control Example 5 | | |
| --- | --- | --- |
| | 23° C. | 80° C. |
| Flexural Strength (kg/cm²) | 1,300 | 1,010 |
| Flexural Modulus (kg/cm²) | 39,000 | 32,400 |
| Izod Impact Value (kg · cm/cm) | 39 | — |

The results show that the product is excellent in flexural modulus at high temperature.

What is claimed is:

1. A stampable sheet which comprises 95 to 20% by weight of (a) a styrene polymer having a syndiotactic configuration and 5 to 80% by weight of (b) a fibrous reinforcing material having an average fiber length of at least 1 mm.

2. The stampable sheet according to claim 1, which is prepared by mixing and melting of 95 to 20% by weight of (a) a styrene polymer having a syndiotactic configuration and 5 to 80% by weight of (b) a fibrous reinforcing material having an average fiber length of at least 1 mm.

3. The stampable sheet according to claim 1, which is obtained by laminating a layer of a (a) styrene polymer having a syndiotactic configuration and a layer of (b) a fibrous reinforcing material having an average fiber length of at least 1 mm (b) to prepare a laminate consisting of two or more layers which contains 95 to 20% by weight of (a) and 5 to 80% by weight of (b).

4. The stampable sheet according to any one of claims 1 to 3, wherein the form of the styrene polymer having a syndiotactic configuration is powder, pellet, fiber, sheet or mat.

5. The stampable sheet according to any one of claims 1 to 3, wherein the form of the fibrous reinforcing material having an average fiber length of at least 1 mm is fiber, chopped strand, wisker, continuous long fiber, sheet or mat.

6. The stampable sheet according to any one of claims 1 to 3, wherein weight average molecular weight of the styrene polymer having a syndiotactic configuration is 100,000 to 800,000.

7. A stampable sheet which comprises 95 to 20% by weight of (a) a first styrene polymer having a syndiotactic configuration and 5 to 80% by weight of (b) a fibrous reinforcing material having an average fiber length of at least 1 mm and (c) a polymer having a polar group which contains polyphenylene ether or polyphenylene ether and a second styrene polymer as a main ingredient.

8. The stampable sheet according to claim 7, which contains 90 to 40% by weight of (a) a styrene polymer having a syndiotactic configuration and 10 to 60% by weight of (b) a fibrous reinforcing material having an average fiber length of at least 1 mm.

9. The stampable sheet according to claim 7, wherein the ratio of the component (c) to be compounded is 1 to 20 parts by weight based on 100 parts by weight of the component (a).

10. The stampable sheet according to claim 7, wherein the component (c) is obtained by modification of polyphenylene ether or polyphenylene ether and a styrene polymer with acid anhydride or a compound having an epoxy group.

11. The stampable sheet according to claim 7, wherein the form of the styrene polymer having a syndiotactic configuration is powder, pellet, fiber, sheet or mat.

12. The stampable sheet according to claim 7, wherein the form of the fibrous reinforcing material having an average fiber length of at least 1 mm is fiber, chopped strand, wisker, continuous long fiber, sheet or mat.

13. The stampable sheet according to claim 7, wherein the weight average molecular weight of the styrene polymer having a syndiotactic configuration is 100,000 to 800,000.

14. The stampable sheet according to claim 1, wherein the syndiotactic configuration of the styrene polymer is defined by a proportion of racemic pentad of at least 30%.

15. The stampable sheet according to claim 14, wherein the proportion of racemic pentad is at least 50%.

16. The stampable sheet according to claim 14, wherein the weight average molecular weight of the styrene polymer having a syndiotactic configuration is 100,000 to 800,000.

17. The stampable sheet according to claim 14, wherein the fibrous reinforcing material is glass fiber, carbon fiber, ceramic fiber of gypsum, potassium titanate, magnesium sulfate, magnesium oxide, asbestos, alumina, silica, boron; wiskers of boron, alumina, silica, silicon carbide; metal fibers of copper, aluminum or steel; an aromatic amide fiber, silk or kemp.

18. The stampable sheet according to claim 7, wherein the syndiotactic configuration of the styrene polymer is defined by a proportion of racemic pentad of at least 30%.

19. The stampable sheet according to claim 18, wherein the proportion of racemic pentad is at least 50%.

20. The stampable sheet according to claim 18, wherein the weight average molecular weight of the styrene polymer having a syndiotactic configuration is 100,000 to 800,000.

21. The stampable sheet according to claim 18, wherein the fibrous reinforcing material is glass fiber, carbon fiber, ceramic fiber of gypsum, potassium titanate, magnesium sulfate, magnesium oxide, asbestos, alumina, silica, boron; wiskers of boron, alumina, silica, silicon carbide; metal fibers of copper, aluminum or steel; an aromatic amide fiber, silk or kemp.

22. The stampable sheet according to claim 1, wherein the outer layers of the laminate are layers of said (a) styrene polymer having a syndiotactic configuration.

23. The stampable sheet according to claim 7, wherein the sheet is in the form of a laminate.

24. The stampable sheet according to claim 23, wherein the outer layers of the laminate are layers of said (a) styrene polymer having a syndiotactic configuration.

* * * * *